(12) United States Patent
Shimazu et al.

(10) Patent No.: US 11,967,584 B2
(45) Date of Patent: Apr. 23, 2024

(54) POWER SEMICONDUCTOR DEVICE

(71) Applicant: Hitachi Astemo, Ltd., Hitachinaka (JP)

(72) Inventors: Hiromi Shimazu, Tokyo (JP); Yujiro Kaneko, Hitachinaka (JP); Toru Kato, Hitachinaka (JP); Akira Matsushita, Hitachinaka (JP); Eiichi Ide, Tokyo (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 328 days.

(21) Appl. No.: 17/293,168

(22) PCT Filed: Nov. 5, 2019

(86) PCT No.: PCT/JP2019/043182
§ 371 (c)(1),
(2) Date: May 12, 2021

(87) PCT Pub. No.: WO2020/105407
PCT Pub. Date: May 28, 2020

(65) Prior Publication Data
US 2022/0013432 A1 Jan. 13, 2022

(30) Foreign Application Priority Data
Nov. 21, 2018 (JP) ................................. 2018-217859

(51) Int. Cl.
| *H01L 25/07* | (2006.01) |
|---|---|
| *H01L 21/48* | (2006.01) |
| *H01L 23/367* | (2006.01) |
| *H01L 23/373* | (2006.01) |
| *H01L 25/00* | (2006.01) |
| *H01L 23/473* | (2006.01) |

(52) U.S. Cl.
CPC ........ *H01L 25/072* (2013.01); *H01L 21/4882* (2013.01); *H01L 23/3672* (2013.01);
(Continued)

(58) Field of Classification Search
CPC ............... H01L 25/072; H01L 21/4882; H01L 23/3672; H01L 23/3735; H01L 25/50;
(Continued)

(56) References Cited

U.S. PATENT DOCUMENTS

2014/0098588 A1 4/2014 Kaneko
2015/0085446 A1 3/2015 Hable et al.
(Continued)

FOREIGN PATENT DOCUMENTS

DE 10 2014 113 694 A1 3/2015
JP H10-189845 A 7/1998
(Continued)

OTHER PUBLICATIONS

Office Action issued in corresponding German Patent Application No. 11 2019 005 234.9, dated Aug. 11, 2021 with English translation.
(Continued)

*Primary Examiner* — Patricia D Valenzuela
(74) *Attorney, Agent, or Firm* — Foley & Lardner LLP

(57) ABSTRACT

A power semiconductor device includes an insulating substrate on which a first conductor layer is arranged on one surface, a first conductor that is connected to the first conductor layer via a first connecting material, and a semiconductor element that is connected to the first conductor via a first connecting material. When viewed from a direction perpendicular to an electrode surface of the semiconductor element, the first conductor includes a peripheral portion formed larger than the semiconductor element. A first recess is formed in the peripheral portion so that a thickness of the first connecting material becomes thicker than other portions.

13 Claims, 22 Drawing Sheets

(52) U.S. Cl.
CPC .......... *H01L 23/3735* (2013.01); *H01L 25/50* (2013.01); *H01L 23/473* (2013.01); *H01L 2224/32225* (2013.01)

(58) Field of Classification Search
CPC ......... H01L 24/27; H01L 24/32; H01L 24/33; H01L 2224/27334; H01L 2224/29017; H01L 2224/29018; H01L 2224/29019; H01L 2224/29083; H01L 2224/291; H01L 2224/32227; H01L 2224/32245; H01L 2224/3303; H01L 2224/83424; H01L 2224/83447; H01L 2224/8384; H01L 2924/181; H01L 2924/351; H01L 23/3677; H01L 23/4334; H01L 23/49811; H01L 23/5386; H01L 24/29; H01L 23/49562; H01L 2224/33181; H01L 25/18; H01L 2224/32225; H01L 23/473
See application file for complete search history.

(56) References Cited

U.S. PATENT DOCUMENTS

2016/0126157 A1* 5/2016 Jeon .................... H01L 23/3675
257/693

2016/0197028 A1* 7/2016 Yamada ................ H01L 23/473
257/714
2018/0174998 A1 6/2018 Sato
2018/0286702 A1 10/2018 Kawashima
2020/0035588 A1 1/2020 Kawashima

FOREIGN PATENT DOCUMENTS

| | | |
|---|---|---|
| JP | 2008-282834 A | 11/2008 |
| JP | 2009-070907 A | 4/2009 |
| JP | 2012-257369 A | 12/2012 |
| JP | 2018-101664 A | 6/2018 |
| WO | WO 2015/033515 A1 | 3/2015 |
| WO | WO 2017/119286 A1 | 7/2017 |
| WO | WO 2018/179981 A1 | 10/2018 |

OTHER PUBLICATIONS

International Search Report with English translation and Written Opinion issued in corresponding application No. PCT/JP2019/043182 dated Mar. 3, 2020.

* cited by examiner

POWER SEMICONDUCTOR DEVICE

TECHNICAL FIELD

The present invention relates to a power semiconductor device, particularly to a power semiconductor device applied to a power conversion device for controlling a motor for driving a vehicle, but can also be applied to a power conversion device for railways, elevators, industrial equipment, aircraft and the like.

BACKGROUND ART

In power conversion devices for hybrid vehicles and electric vehicles, power semiconductor devices having a high operating voltage are desired for the purpose of shortening the charging time. In a power semiconductor device having a high operating voltage, it is necessary to use an insulating member such as a ceramic substrate having a high dielectric voltage as an insulating member. For example, PTL 1 is disclosed as a power semiconductor device to which a ceramic substrate is applied as an insulating material.

On the other hand, miniaturization of the power conversion device and cooling performance are also required. For example, as disclosed in PTL 2, a power semiconductor device of a double-sided direct cooling system is disclosed.

CITATION LIST

Patent Literature

PTL 1: JP 10-189845 A
PTL 2: JP 2012-257369 A

SUMMARY OF INVENTION

Technical Problem

In a power semiconductor device in which a conductor plate is connected to an insulating substrate such as ceramic with a connecting material such as solder, when the power semiconductor element repeatedly generates heat (when the power semiconductor device repeatedly operates and stops), the connecting material is repeatedly applied with a large strain, so there is a concern about fatigue fracture.

In particular, the connecting material that connects the conductor plate and the insulating substrate has a large amount of temperature rise and a large area of the connecting material. Therefore, the strain of the connecting material becomes large and there is a concern about fatigue fracture.

An object of the invention is to provide a highly reliable power semiconductor device.

Solution to Problem

In order to solve the above problems, a power semiconductor device according to the invention includes an insulating substrate on which a first conductor layer is arranged on one surface, a first conductor connected to the first conductor layer via a first connecting material, and a semiconductor element connected to a first conductor via a second connecting material. When viewed from the direction perpendicular to the electrode surface of the semiconductor element, the first conductor has a peripheral portion formed larger than the semiconductor element, and a first recess is formed in the peripheral portion such that the thickness of the first connecting material becomes thicker than other portions.

Advantageous Effects of Invention

According to the invention, a highly reliable power semiconductor device can be realized. Objects, configurations, and effects besides the above description will be apparent through the explanation on the following embodiments.

BRIEF DESCRIPTION OF DRAWINGS

FIG. 15($b$) is a diagram illustrating a manufacturing process of the power semiconductor device according to an embodiment of the invention.

FIG. 15($c$) is a diagram illustrating a manufacturing process of the power semiconductor device according to an embodiment of the invention.

FIG. 15($d$) is a diagram illustrating a manufacturing process of the power semiconductor device according to an embodiment of the invention.

FIG. 16($b$) is a graph illustrating the relationship between the recess width/recess depth ratio and the solder strain.

DESCRIPTION OF EMBODIMENTS

First Embodiment

Figure 1:
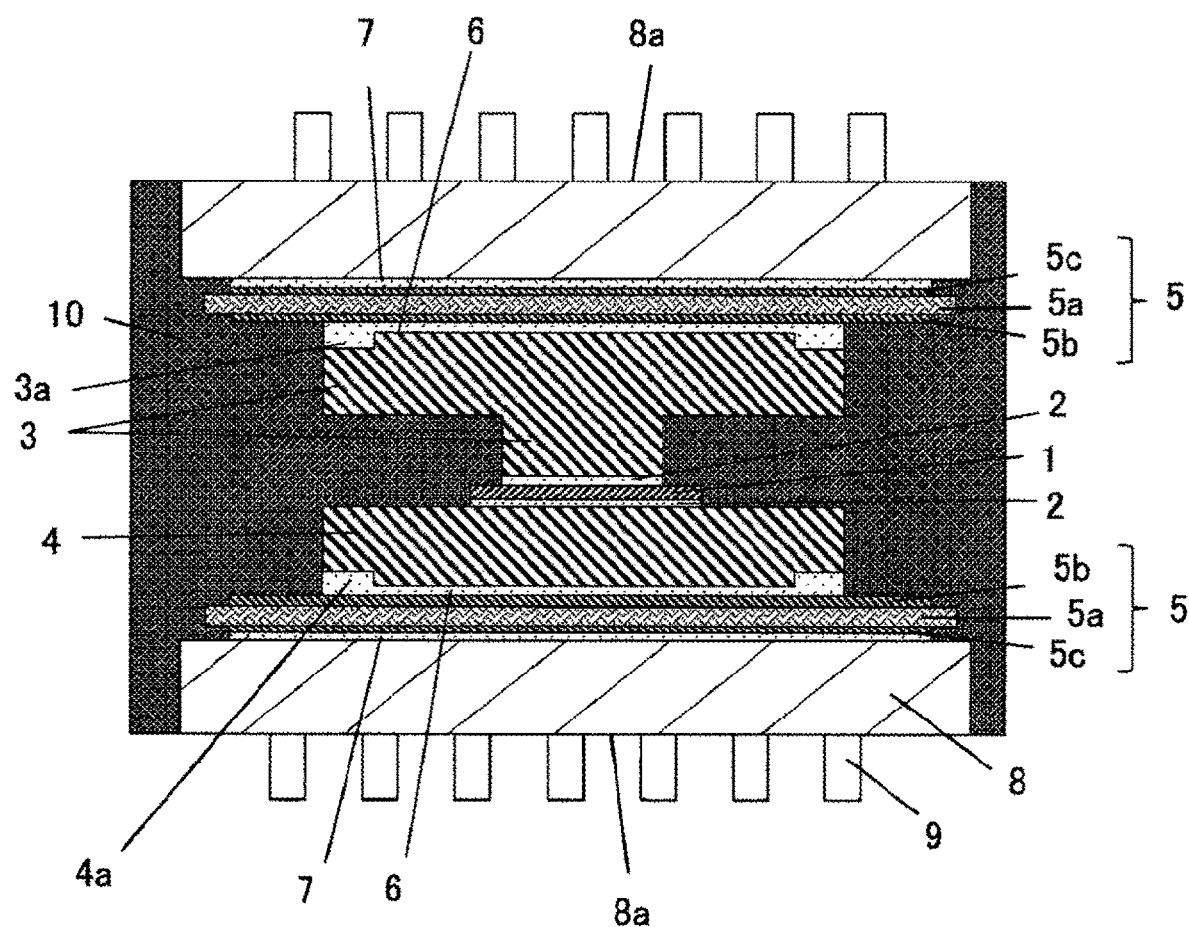
FIG. 1 is a cross-sectional view of a power semiconductor device according to a first embodiment of the invention.
Figure 12:
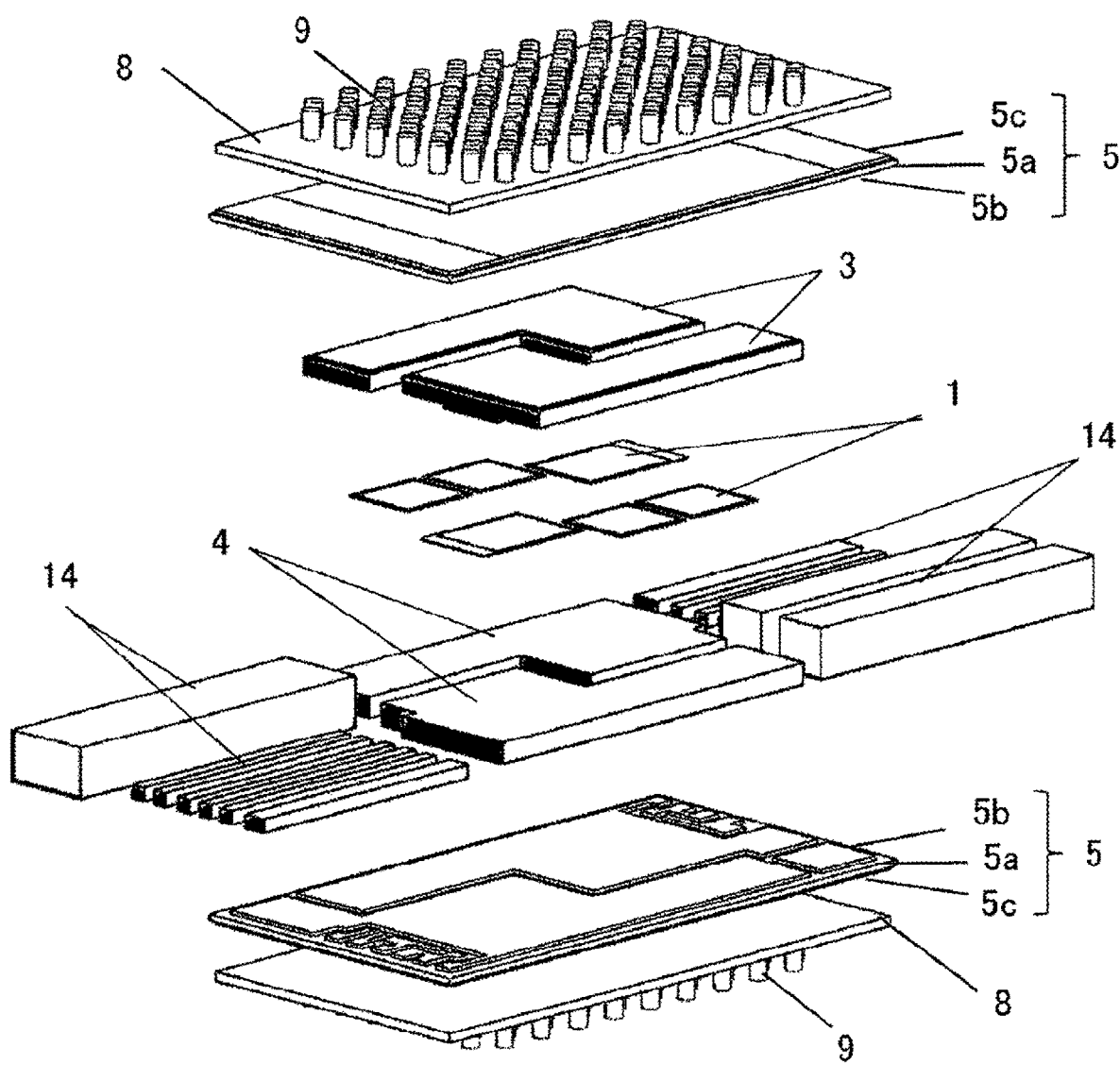
FIG. 12 is an exploded perspective view of the power semiconductor device according to the first embodiment of the invention.
Figure 13:
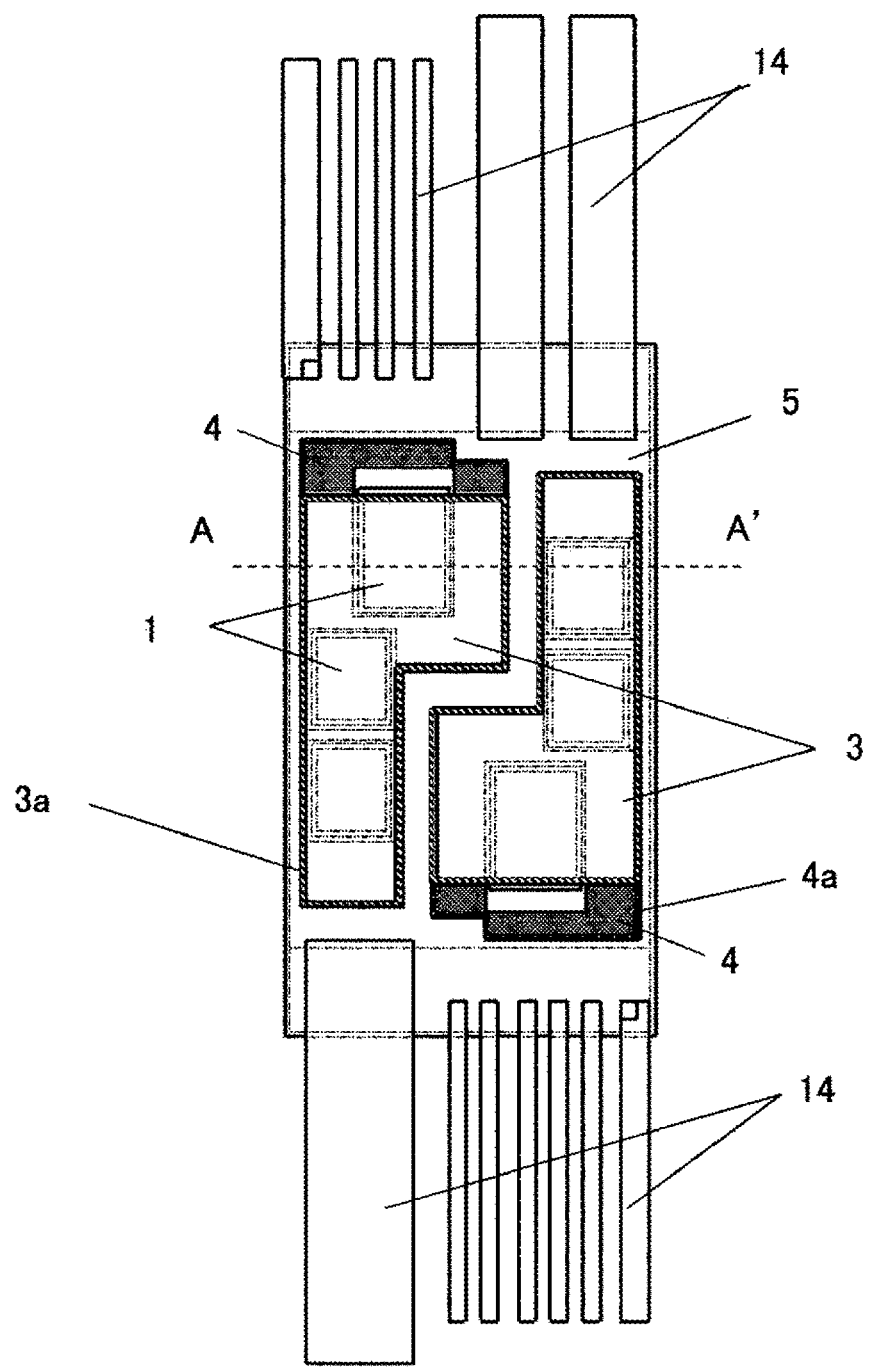
FIG. 13 is a front view of the power semiconductor device according to the first embodiment of the invention.

FIG. 13 is a front view of a power semiconductor device according to this embodiment. FIG. 12 is an exploded perspective view of the power semiconductor device according to the first embodiment of the invention. FIG. 1 is a cross-sectional view of the power semiconductor device according to the first embodiment of the invention. FIG. 1 illustrates a part of the cross section at A-A' in FIG. 12.

Hereinafter, an embodiment of the power semiconductor device according to the invention will be described with reference to FIG. 1. As illustrated in FIG. 1, in the power semiconductor device of this embodiment, a power semiconductor element 1 is sandwiched between a first conductor 3 and a second conductor 4 which are arranged to face the electrode surface of each electrode. The power semiconductor element 1 is joined to the first conductor 3 and the second conductor 4 by a connecting material 2, respectively. The first conductor 3 and the second conductor are formed of, for example, copper, a copper alloy, aluminum, an aluminum alloy, or the like, and the connecting material 2 is formed of a solder material, a sintered material, or the like. Although FIG. 1 illustrates a case where the first conductor 3 is formed of a single member, a plurality of members may be joined to form the first conductor 3. The insulating substrate 5 is composed of an insulating member 5a, a first conductor layer 5b, and a second conductor layer 5c. The first conductor layer 5b is arranged on one surface of the insulating member 5a, and the second conductor layer 5c is arranged on the other surface. The surface of the first conductor 3 opposite to the surface connected to the power semiconductor element 1 is connected to the first conductor layer 5b via a connecting material 6. The second conductor layer 5c is connected to a heat dissipation member 8 via a connecting material 7. Heat dissipation fins 9 are formed on the surface of the heat dissipation member 8.

Figure 11:
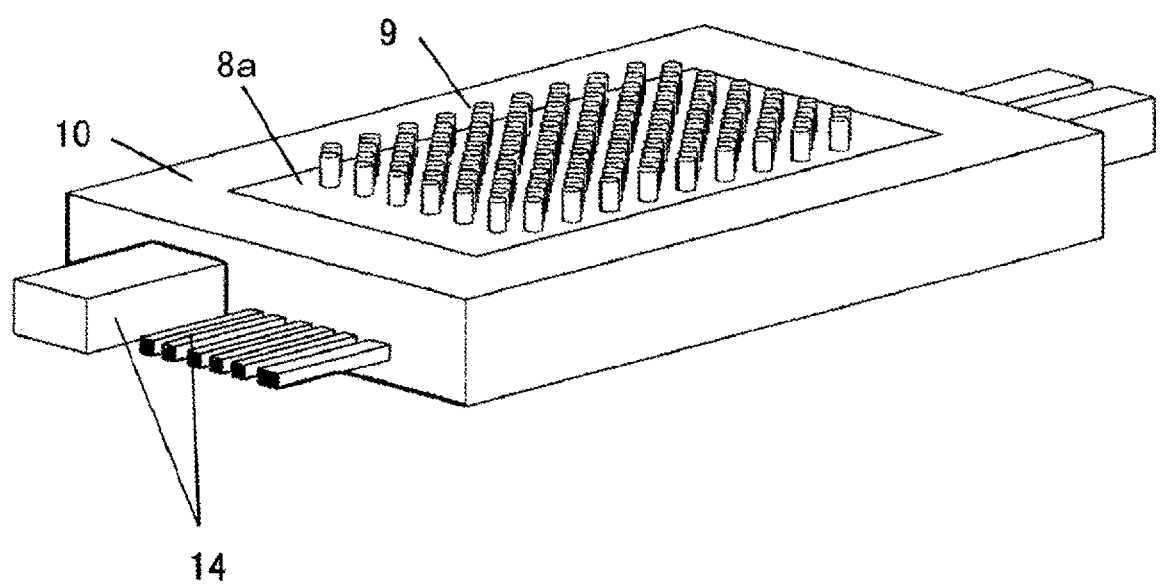
FIG. 11 is an external view of the power semiconductor device according to the first embodiment of the invention.

Similarly, the surface of the second conductor 4 opposite to the surface connected to the power semiconductor element 1 is connected to the first conductor layer 5b via the connecting material 6. In the insulating substrate 5, the first conductor layer 5b is arranged on one surface of the insulating member 5a, and the second conductor layer 5c is arranged on the other surface. The second conductor layer 5c is connected to the heat dissipation member 8 via the connecting material 7. The heat dissipation fins 9 are formed on the surface of the heat dissipation member 8. The heat insulating member 5a conducts heat generated from the power semiconductor element 1 to the heat dissipation member 8, and it is preferable to use a material having high thermal conductivity and high insulation withstand voltage. For example, ceramics such as aluminum oxide (alumina), aluminum nitride, and silicon nitride can be used. The connecting material 6 and the connecting material 7 are formed of a solder material, a sintered material, or the like. The heat dissipation member 8 and the heat dissipation fins 9 are formed of a conductive member, for example, a composite such as Cu, Cu alloy, Cu—C, and Cu—CuO, or a composite such as Al, Al alloy, AlSiC, and Al—C. As illustrated in FIG. 12, a terminal 14 is connected to the first conductor layer 5b. FIG. 11 is an external view of the power semiconductor device according to the first embodiment of the invention. As illustrated in FIG. 11, all but a part of a heat dissipation surface 8a and the terminal 14 on which the heat dissipation fins of the heat dissipation member 8 are formed are sealed with a sealing resin 10.

With the above configuration, the heat generated by the power semiconductor element 1 can be thermally conducted to the insulating substrate 5 via the first conductor 3 and the second conductor 4, and can be efficiently dissipated to the outside through the heat dissipation member 8. Further, since a ceramic having a high dielectric strength is used as the insulating substrate 5, a power semiconductor device having a high operating voltage can be realized. However, in the power semiconductor device in which the insulating substrate 5 such as ceramic, a first conductor plate 3, and a second conductor 4 are connected by a connecting material 6 such as solder, when the power semiconductor element 1 repeatedly generates heat (a case where the power semiconductor device repeatedly operates and stops), a large strain is repeatedly applied to the connecting material 6, so there is a concern about fatigue fracture.

In the power semiconductor device illustrated in FIG. 1, there are three types of bonding interfaces such as solder. The three types are the connecting material 2 on the upper and lower surfaces of the chip, the connecting material 6 for connecting the first conductor and the second conductor to the insulating substrate 5, and the connecting material 7 for connecting the insulating substrate 5 and the heat dissipation member 8. In the repeated operation and stop of the power semiconductor device, the connecting material 6 is a main factor of the largest strain of the connecting material and the fatigue life. This is because the temperature rise of the connecting material 2 is large during the operation of the power semiconductor device, but the strain is small because the contact area is small. Further, although the connecting material 7 has a large contact area, it is arranged near the heat dissipation member 8. Thus, the amount of temperature rise is small and the strain is small. On the other hand, since the connecting material 6 has a large amount of temperature rise and a large connecting area, the strain becomes large and the possibility of fatigue fracture increases. Therefore, in this embodiment, a recess 3a and a recess 4a are provided around the surfaces of the first conductor 3 and the second conductor 4 that are solder-connected to the insulating substrate 5.

Figure 2:
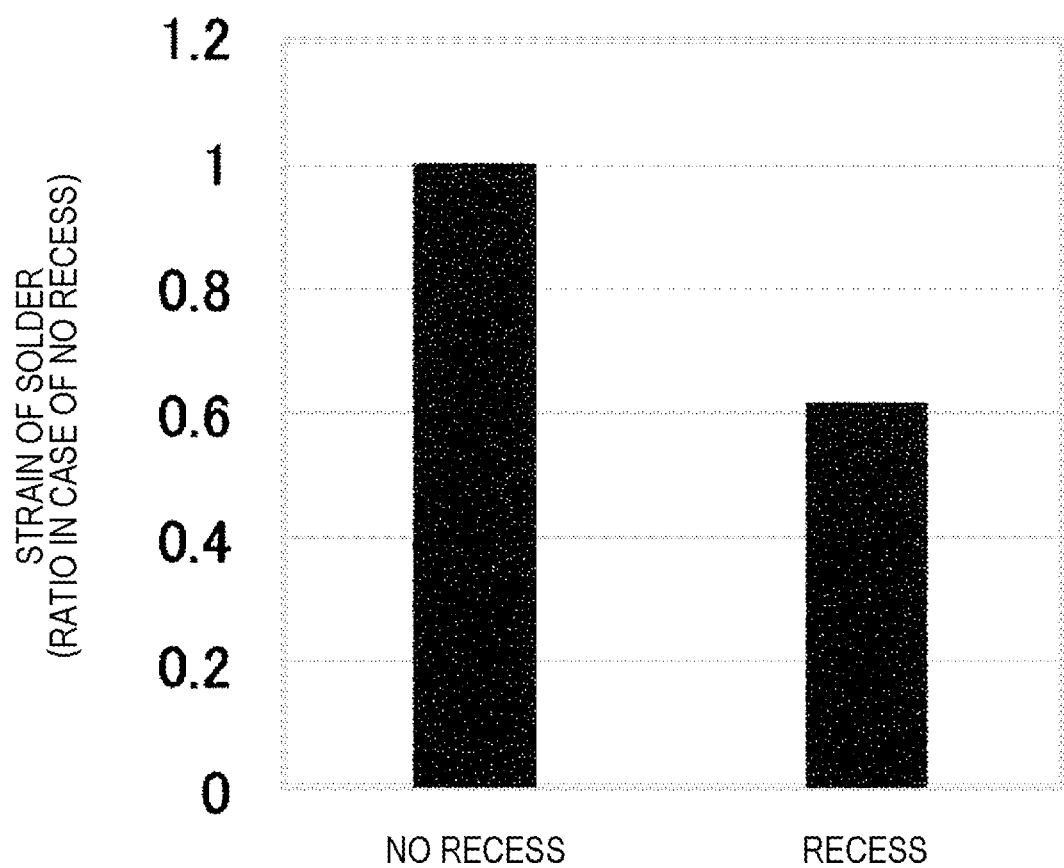
FIG. 2 is a diagram illustrating a comparison result of solder strain.

FIG. 2 is a diagram illustrating the results of comparing the strain of the connecting material 6 when the power semiconductor element 1 generates heat in a case where the connecting material 6 is used as a solder material, with and without the recess 3a and the recess 4a. In the temperature distribution when the active region of the power semiconductor device generates heat, the stress when the temperature distribution occurs is evaluated by the equivalent plastic strain that governs the fatigue fracture of the solder. A comparison has been made based on the maximum strain value near the end of the second conductor 4 of the connecting material 6. As a result, as illustrated in FIG. 2, it has been confirmed that when the strain of the solder in the structure without the recess is set to 1, it can be reduced to 0.61 when the recess is provided. It is considered that this is because the solder strain is reduced due to an increase in thickness of the connecting material (solder thickness) at the end of the connecting material 6 by providing the recess. Therefore, in the peripheral portion of the first conductor 3, the connecting material 6 is formed thicker than the other portions, so that the strain of the solder can be reduced. Therefore, in this embodiment, the strain of the solder connecting material 6 due to the repeated heat generation (power cycle) of the power semiconductor element 1 can be reduced, so that fatigue fracture can be prevented and a highly reliable power semiconductor device can be provided.

Here, the thermal conductivity of the solder material is larger than those of the first conductor 3 and the second conductor 4. Therefore, as the thickness of the connecting material 6 made of the solder material increases, the thermal resistance increases and the heat dissipation property decreases. Therefore, by providing recesses at the positions of the first conductor 3 and the second conductor 4 away from the power semiconductor element 1, the solder thickness of the connecting material 6 only at the end of the first conductor 3 and the second conductor 4 in which the strain is increased can be increased without deteriorating the heat conduction when the chip generates heat, and the strain is reduced. Since the thickness of the solder other than the recesses is relatively thin compared to the periphery, it is possible to suppress an increase in thermal resistance, prevent fatigue fracture of the solder, and realize a highly reliable power semiconductor device.

Figure 3:
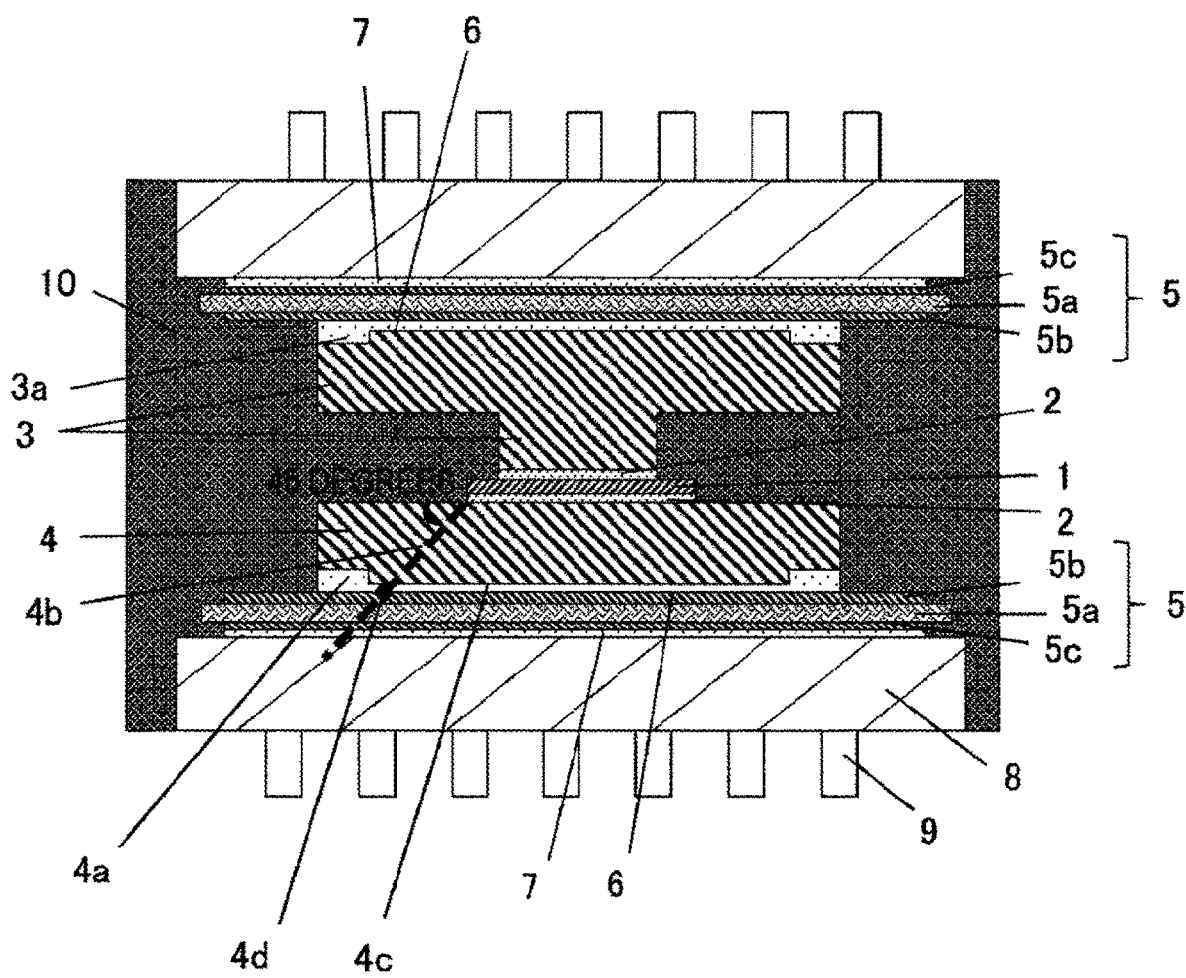
FIG. 3 is a cross-sectional view of the power semiconductor device according to the first embodiment of the invention.

It is desirable that the position where the recess 4a is provided be set in consideration of the heat spread of the chip from one end of the power semiconductor element 1. FIG. 3 is a cross-sectional view of the power semiconductor device according to the first embodiment of the invention. As illustrated in FIG. 3, the angle between a line 4d extending from an intersection 4e between the second conductor 4 and the end of the connecting material 2 to the outside on the surface of the second conductor 4 and a line 4b connecting an intersection 4e and an intersection 4d between the insulating substrate 5 of the second conductor 4 and a joint surface 4c is 45 degrees. At this time, it is more desirable that the position of the recess 4a be provided outside the intersection 4d. That is, when viewed from the direction perpendicular to the electrode surface of the semiconductor element 1, the recess 4a is formed between a virtual line consisting of a set of points separated by the thickness of the first conductor 3 from the end of the semiconductor element 1 and the outer circumference of the first conductor 3. As a result, the deterioration of thermal resistance can be suppressed, so that a more reliable power semiconductor device can be provided.

Figure 16A:
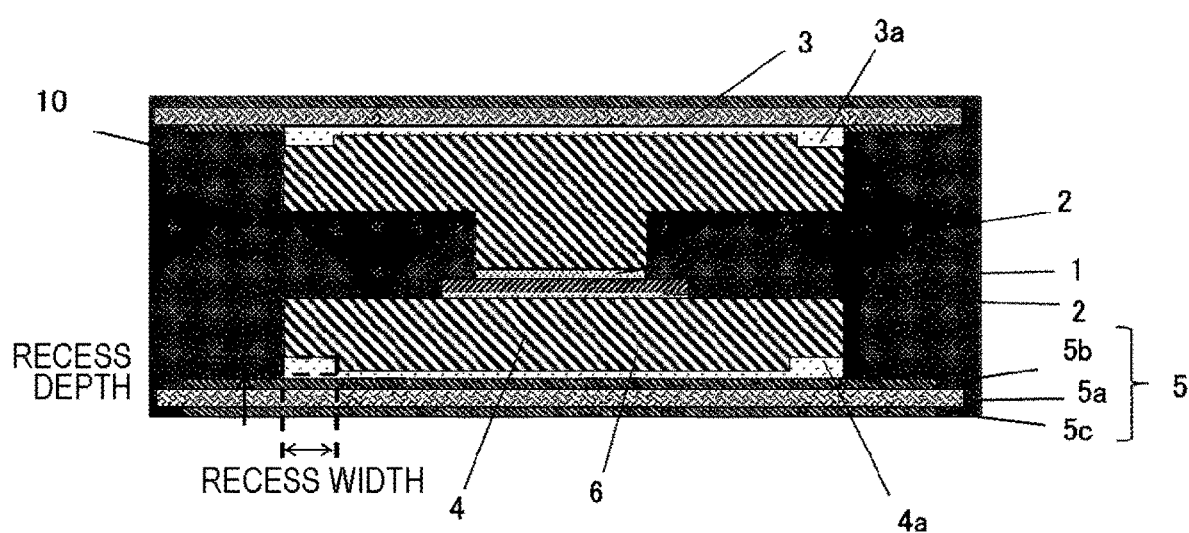
FIG. 16($a$) is a diagram illustrating a recess width/recess depth ratio.
Figure 16B:
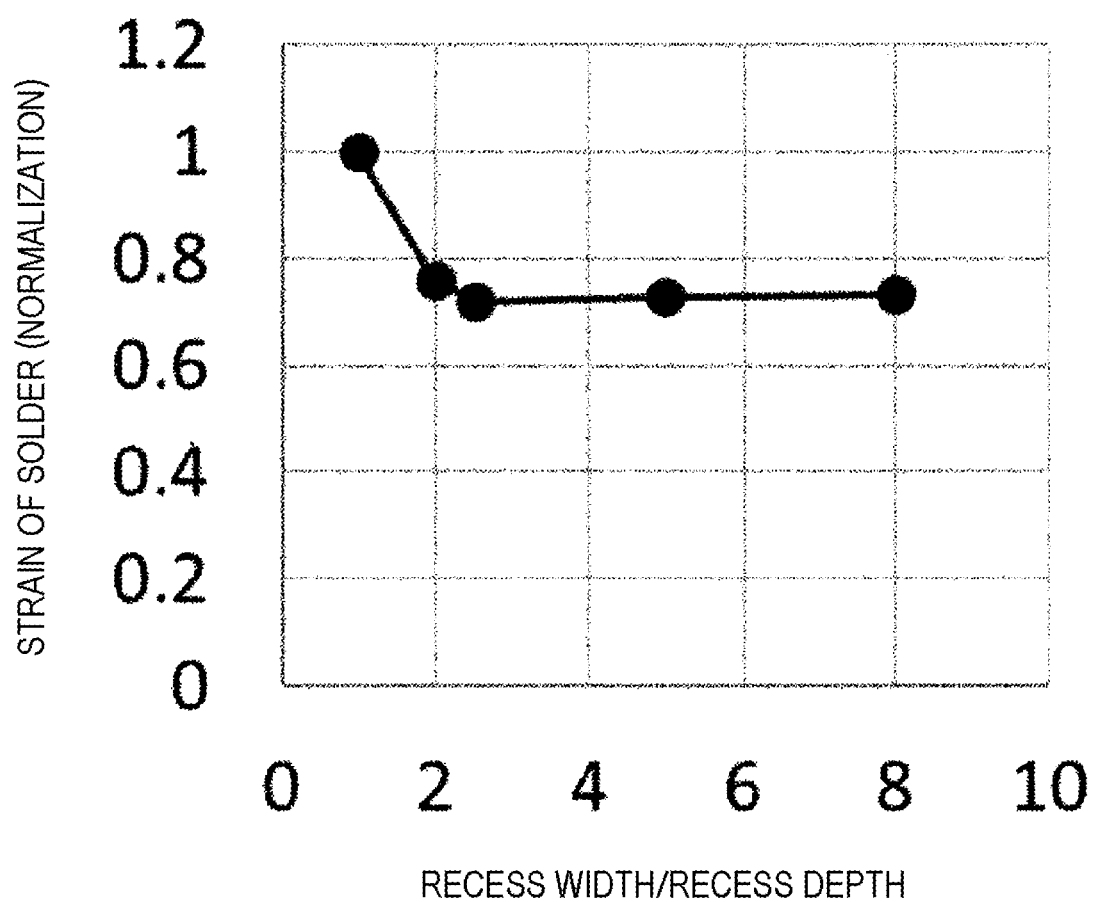

As described above, by increasing the depth of the recess, the solder thickness can be increased and the strain of the solder can be reduced. At this time, it is desirable that the width of the recess be at least twice the depth of the recess. FIG. 16(b) is a diagram illustrating the relationship between the recess width/recess depth ratio and the solder strain. The solder strain during the power cycle of the structure in which the ratio of the recess width to the recess depth is changed has been evaluated. Each value indicates a standardized solder strain value by setting the solder strain to 1 when the recess width/recess depth=1. As illustrated in FIG. 16(b), the strain of the solder increases as the recess width/recess depth value decreases in the region where the recess width/recess depth value is 2 or less. Generally, the strain of the solder is reduced by increasing the thickness of the solder, but the effect cannot be sufficiently obtained only by increasing the depth of the recess. In order to sufficiently obtain the effect of reducing solder strain by forming the recess, it is desirable to form the recess width/recess depth value to be larger than 2. Therefore, when the shapes of the recess 3a and the recess 4b are viewed from the direction perpendicular to the electrode surface of the semiconductor element 1, if the length of the recess 4a and the recess 4b in the width direction parallel to the electrode surface of the semiconductor element 1 is defined as W, and the length in the depth direction is defined as D, W/D is formed to be larger than 2.

Figure 6:
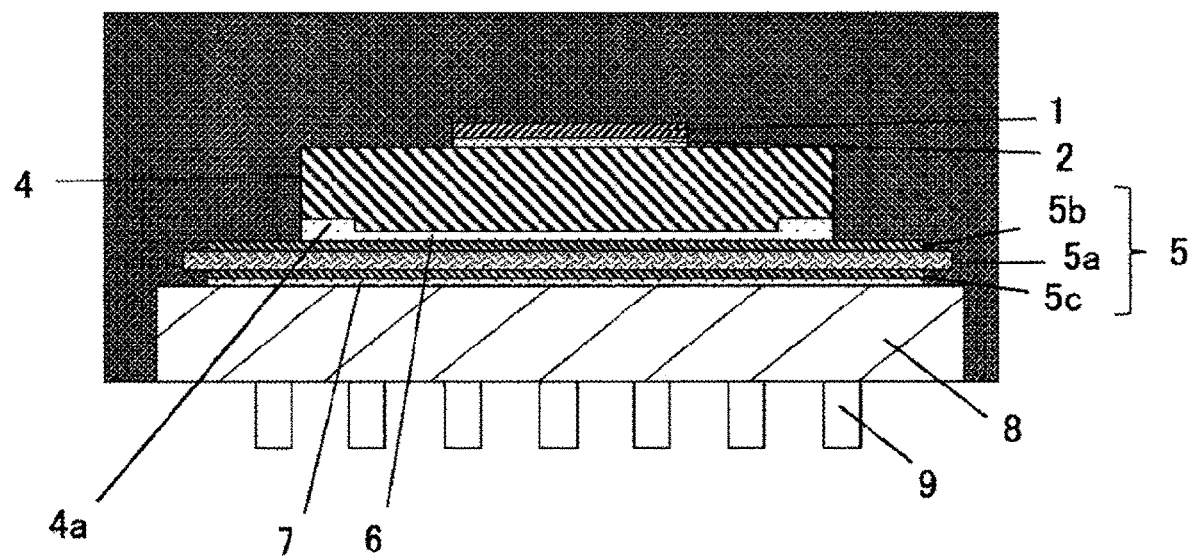
FIG. 6 is a cross-sectional view of a power semiconductor device according to a fourth embodiment of the invention.

Here, in the case of a single-side cooling power semiconductor device structure as illustrated in FIG. 6, when the chip generates heat, warpage deformation occurs in the direction of reducing the strain of the solder of the connecting material 6, whereas deformation occurs to increase the strain of the solder of the connecting material in a power semiconductor device having a double-side cooling structure described in this embodiment. Therefore, the solder strain when the chip generates heat is larger in the double-side cooling structure illustrated in this embodiment. Therefore, the effect of reducing the solder strain of the recess 3a provided in the second conductor 3 is increased.

In this embodiment, the case where the connecting material is solder is illustrated, but other connecting materials such as a sintered material may be used.

Second Embodiment

Figure 4:
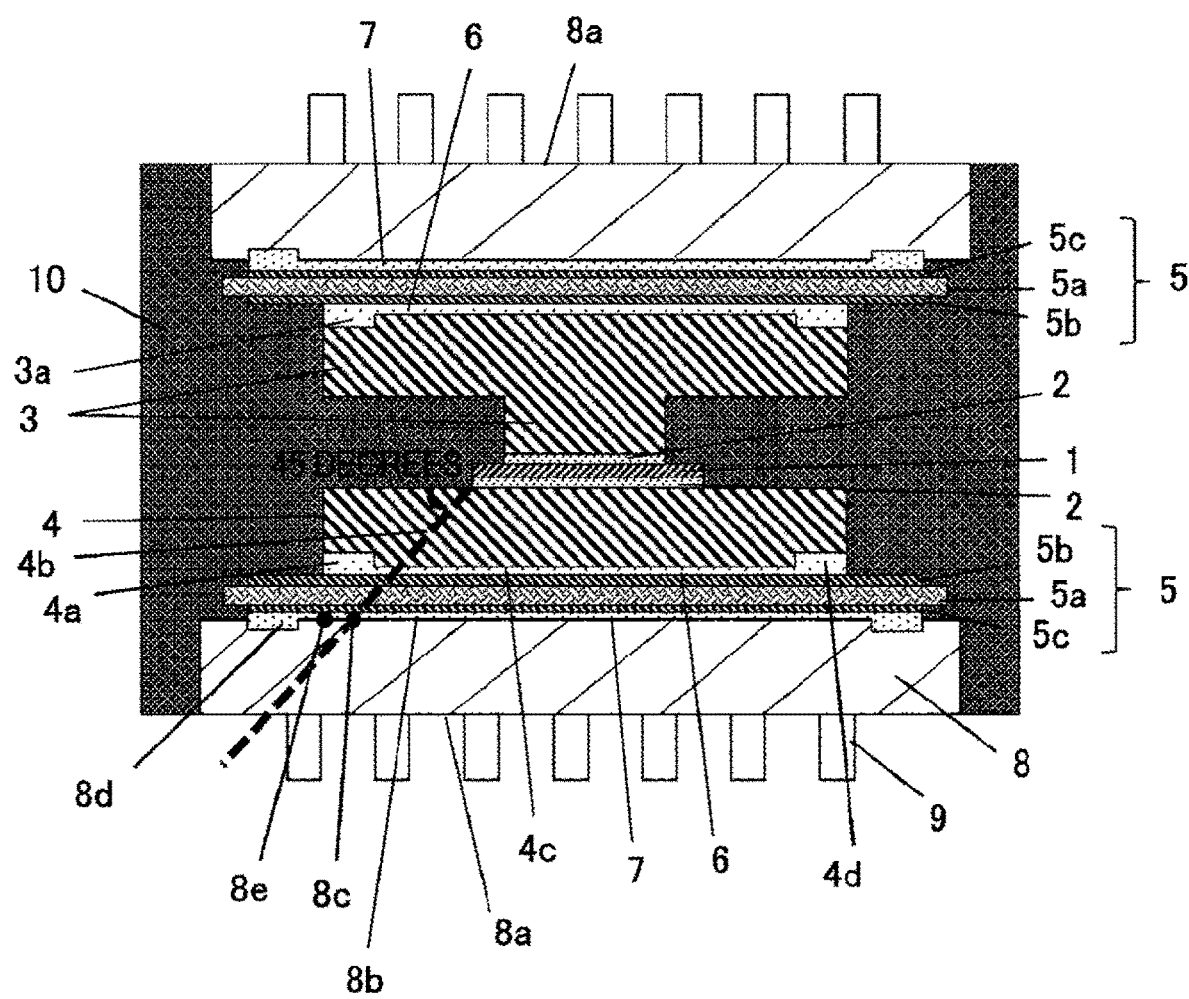
FIG. 4 is a cross-sectional view of a power semiconductor device according to a second embodiment of the invention.

FIG. 4 is a cross-sectional view of a power semiconductor device illustrating a second embodiment of the invention. During manufacturing of a power semiconductor device, warpage occurs due to the difference in thermal conductivity between the insulating substrate 5 and the heat dissipation material 8. Due to this warpage, the strain occurs in the connecting material 7, and the connecting material 7 may be destroyed. In this embodiment, as illustrated in FIG. 4, a recess 8d is provided on a surface 8b of the heat dissipation member 8 on which the insulating substrate 5 is mounted. As a result, the strain is reduced by increasing the thickness of the connecting material (solder thickness) at the end of the connecting material 7, and the destruction of the connecting material 7 is prevented. The position where the recess 8d is provided may be provided outside an intersection 8e with a surface 8b where the insulating substrate of the heat dissipation member in the vertical line from the end of the second conductor 4 to the heat dissipation material 8 is mounted. Further, the position where the recess 8d is provided may be provided outside an intersection 8c between the line 4b at 45 degrees from the end of the power semiconductor element 1 and the surface 8b where the insulating substrate of the heat dissipation member is mounted. With such a configuration, it is possible to suppress deterioration of thermal resistance and provide a highly reliable power semiconductor device.

Third Embodiment

In the first embodiment, one semiconductor element 1 is provided on the first conductor 3, but a plurality of semiconductor elements 1 may be provided on the first conductor 3. As a result, the length in the width direction can be made smaller than that of arranging one semiconductor device with semiconductor elements, and it is possible to provide a more miniaturized power semiconductor device.

Figure 5:
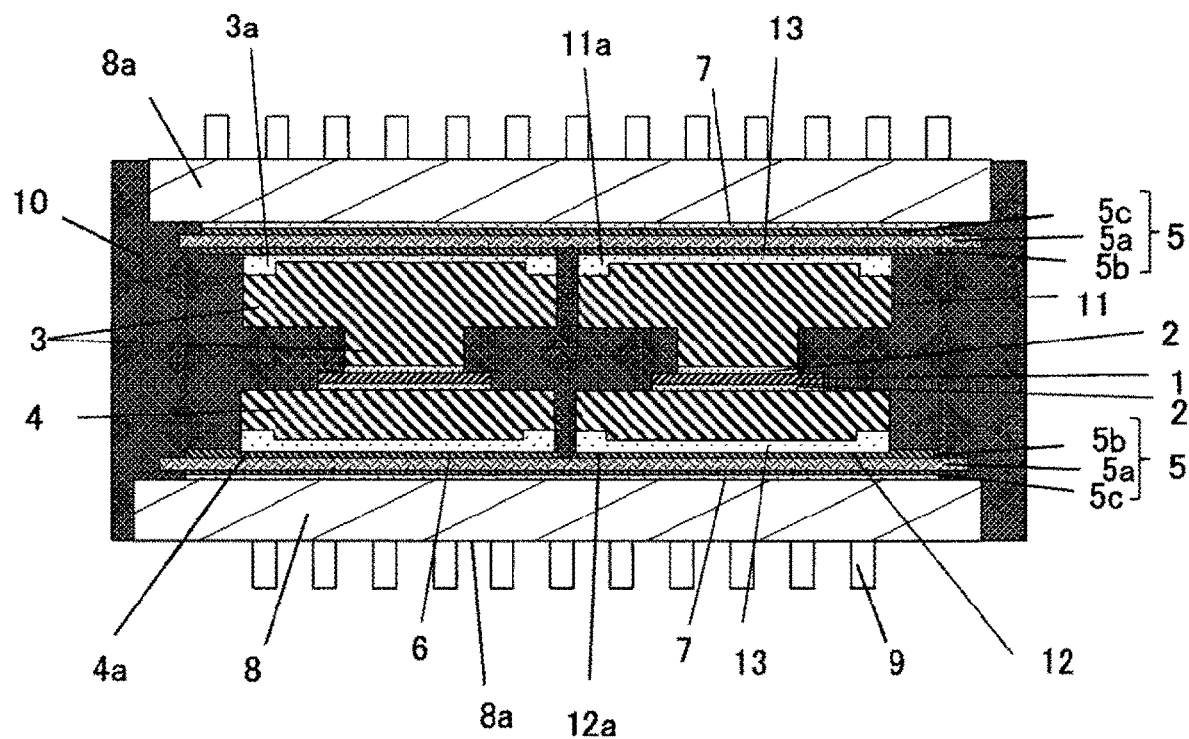
FIG. 5 is a cross-sectional view of a power semiconductor device according to a third embodiment of the invention.

FIG. 5 is a cross-sectional view of a power semiconductor device illustrating this embodiment. As illustrated in FIG. 5, in this embodiment, the first conductor 3 and a third conductor 11 are solder-connected so as to be adjacent to the same surface of the insulating substrate 5. Similarly, the second conductor 4 and a fourth conductor 12 are solder-connected to the first conductor 4. In such a power semiconductor device, the connecting material 6 and a connecting material 13 of adjacent conductors may protrude and bridge each other. In particular, in the case of the double-side cooling module, when the sealing resin 10 is formed, pressure is applied from both sides at a high temperature, so that the connecting material 6 and the connecting material 13 tend to protrude and bridge.

Therefore, in this embodiment, the recess 3a, the recess 4a, a recess 11a, and a recess 12a are provided on the outer peripheral portion of the connection surface of the first conductor 3, the second conductor 4, the third conductor 11, and the fourth conductor 12 with the insulating substrate 5. As a result, the solder extruded from the center to the outside flows into each recess, so that the solder can be prevented from squeezing out. Therefore, it is possible to prevent the connecting material 6 and the connecting material 13 of the adjacent conductors from protruding and bridging, and it is possible to improve reliability and assembling property.

Fourth Embodiment

In the first embodiment illustrated in FIG. 1, an example of the power semiconductor device of the double-side cooling structure has been described in which the first conductor 3 and the second conductor 4 are connected to the front and back surfaces of the power semiconductor element 1 by the connecting material 2, and further outside the insulating substrate 5 and the heat dissipation member 8 are connected by the connecting material 6 and the connecting material 7. However, as illustrated in FIG. 6, it may be a power semiconductor device having a single-side cooling structure. The power semiconductor element 1 is in contact with the second conductor 4 via the connecting material 2. Further, the power semiconductor element 1 is connected to the first conductor layer 5b of the insulating substrate 5 via the connecting material 6, and the second conductor layer 5c of the insulating substrate 5 is connected to the heat dissipation member 8. Here, in the case of such a structure, the difference in the thermal expansion coefficient between the first conductor 1 and the insulating substrate 5 becomes large, so that even if the power semiconductor device has a single-side cooling structure, the strain of the connecting material 6 is large.

Therefore, the recess 4a is provided around the surface of the second conductor 4 that is solder-connected to the insulating substrate 5. As a result, the thickness of the connecting material 6 becomes thicker at the peripheral portion of the second conductor 4 than at the other portions, so that the strain of the solder can be reduced. Further, since the thickness of the solder other than the recess 4a is relatively thin as compared with the periphery, fatigue fracture of the solder can be prevented without increasing the thermal resistance, and a highly reliable power semiconductor device can be realized.

Fifth Embodiment

Figure 7:
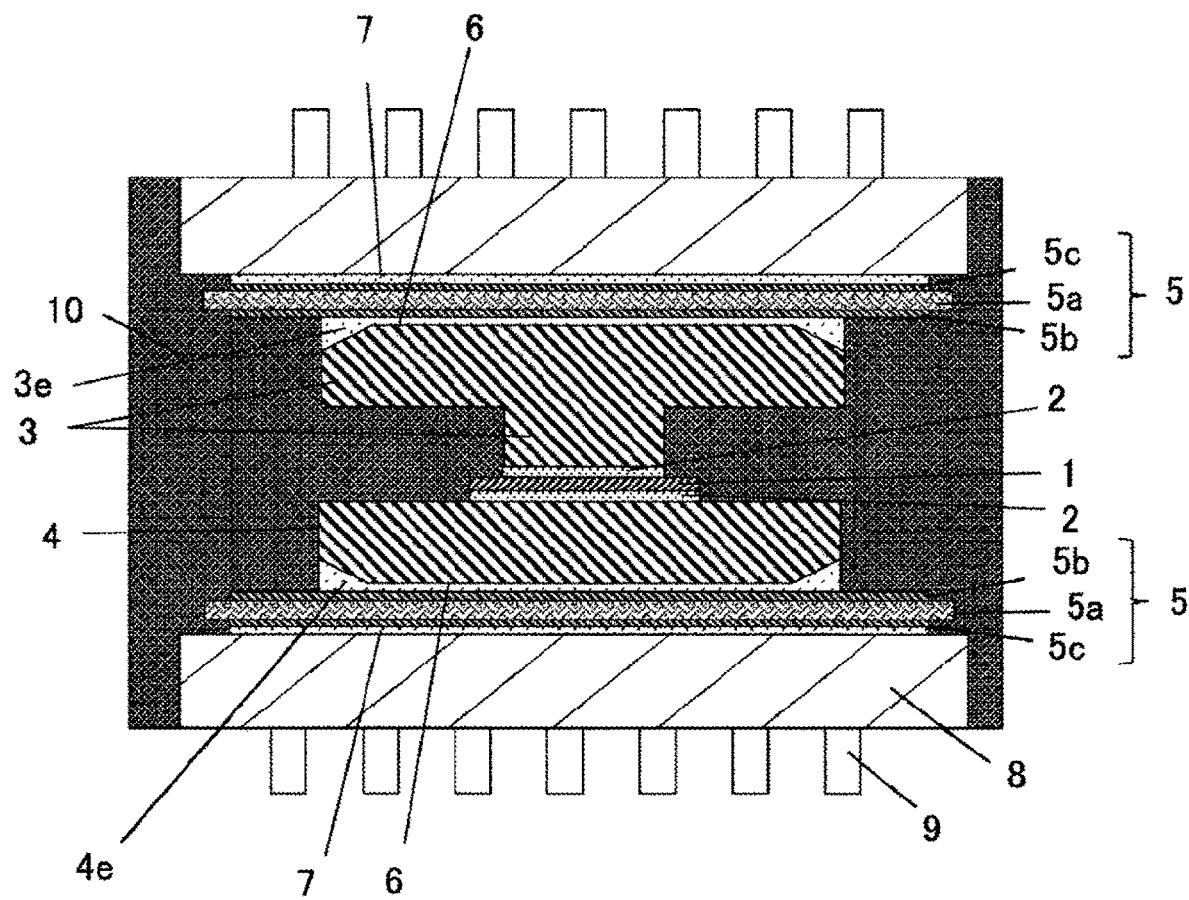
FIG. 7 is a cross-sectional view of a power semiconductor device according to a fifth embodiment of the invention.

FIG. 7 is a cross-sectional view of a power semiconductor device illustrating a fifth embodiment of the invention. In the first embodiment illustrated in FIG. 1, an example in which the shape of the recess 3a and the recess 4a provided around the surface solder-connected to the insulating substrate 5 of the first conductor 3 and the second conductor 4 is a stepped shape has been described However, when the shape of the recess 3a and the recess 4a is the stepped shape, the connecting material 6 may not be filled up to the corner of the step, and a gap may be generated. Therefore, in this embodiment, as illustrated in FIG. 7, the shape of the recess is formed into a tapered shape such as a recess 3e and a recess 4e. That is, when viewed from the direction perpendicular to the electrode surface of the semiconductor element 1, the depths of the recess 3e and the recess 4e are formed so as to be larger on the side farther from the side closer to the semiconductor element 1.

By tapering the recess 3e and the recess 4e, the thickness of the solder becomes thinner on the inside, which affects heat conduction, so the effect on thermal resistance is smaller than when the recesses are formed in the stepped shape. Further, the tapered shape can be easily processed as compared with the stepped shape. Further, it is possible to prevent a gap from being generated between the first conductor 3 and the connecting material 6 and to reduce the adhesiveness of the solder.

Figure 17:
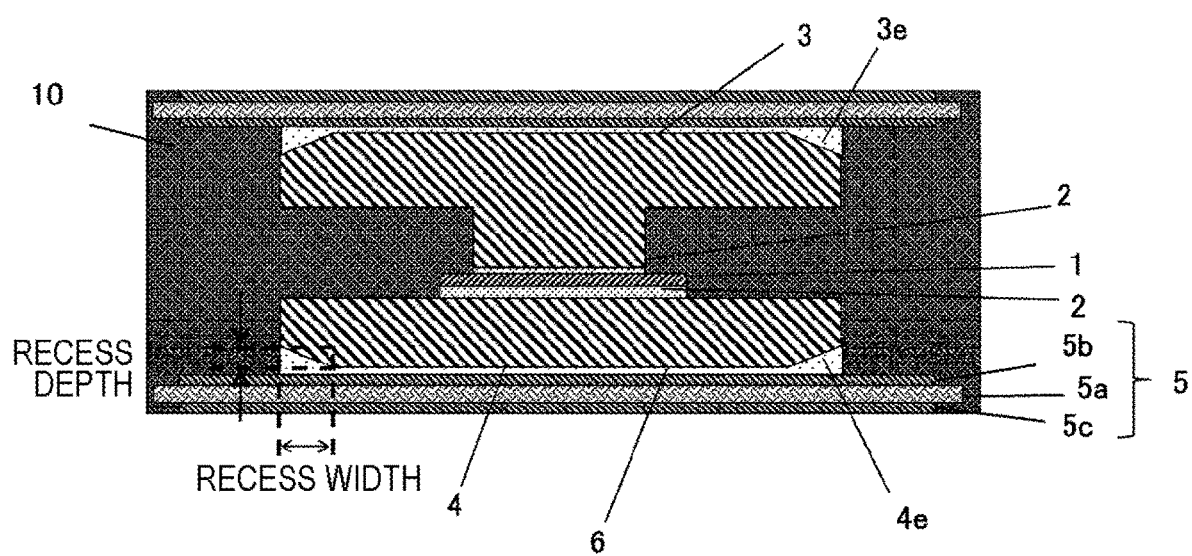
FIG. 17 is a cross-sectional view of the power semiconductor device according to the fifth embodiment of the invention.

Further, as illustrated in FIG. 17, when the shape of the recess 3e and the recess 4e is viewed from the direction perpendicular to the electrode surface of the semiconductor element 1, if the length in the width direction parallel to the electrode surface of the semiconductor element 1 is defined as W in the recess 3e and the recess 4e, and the length in the depth direction is defined as D, W/D may be formed larger than 2. As a result, the thickness of the solder material of the connecting material 3 and the connecting material 6 becomes thicker than the other parts in the peripheral portion of the first conductor 3 and the second conductor 4, so that the effect of reducing the solder strain can be expected. Further, since the thickness of the solder other than the recesses is relatively thin as compared with the periphery, fatigue fracture of the solder can be prevented without increasing the thermal resistance. In addition, it is possible to prevent a gap from being formed between the first conductor 3 and the connecting material 6, and a highly reliable power semiconductor device can be realized.

Sixth Embodiment

Figure 8:
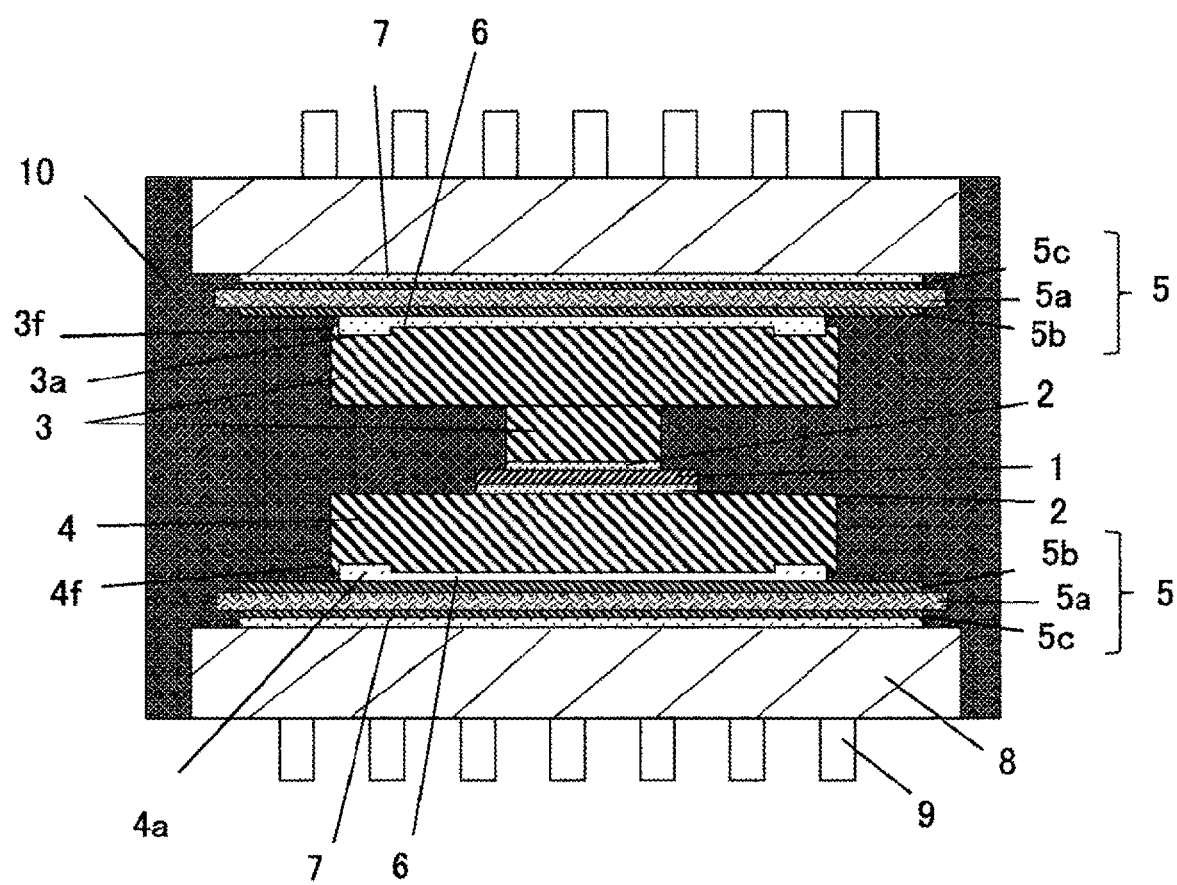
FIG. 8 is a cross-sectional view of a power semiconductor device according to a sixth embodiment of the invention.

FIG. 8 is a cross-sectional view of a power semiconductor device illustrating the fifth embodiment of the invention. In the first embodiment illustrated in FIG. 1, an example in which the shape of the recess 3a and the recess 4a provided around the surface solder-connected to the insulating substrate 5 of the first conductor 3 and the second conductor 4 is a stepped shape, and provided on the outermost circumference of the first conductor 3 and the second conductor 4 has been described. In this embodiment, as illustrated in FIG. 8, a wall 3f and a wall 4f are provided on the outermost circumferences of the first conductor 3 and the second conductor 4. Also in this case, the strain of the solder can be reduced by making the thickness of the solder material of the connecting material 6 thicker than the other parts in the peripheral portions of the first conductor and the second conductor. Further, since the thickness of the solder other than the recess 3a and the recess 4a is relatively thin compared to the periphery, fatigue fracture of the solder can be prevented without increasing the thermal resistance, and a highly reliable power semiconductor device can be realized. Further, the wall 3f and the wall 4f may be configured so that at least a part of the wall 3f and the wall 4f comes into contact with the first conductor layer 5b. By doing so, it is possible to prevent the solder from spreading near the wall 3f and the wall 4f, and further prevent the solder from squeezing out.

Seventh Embodiment

Figure 9:
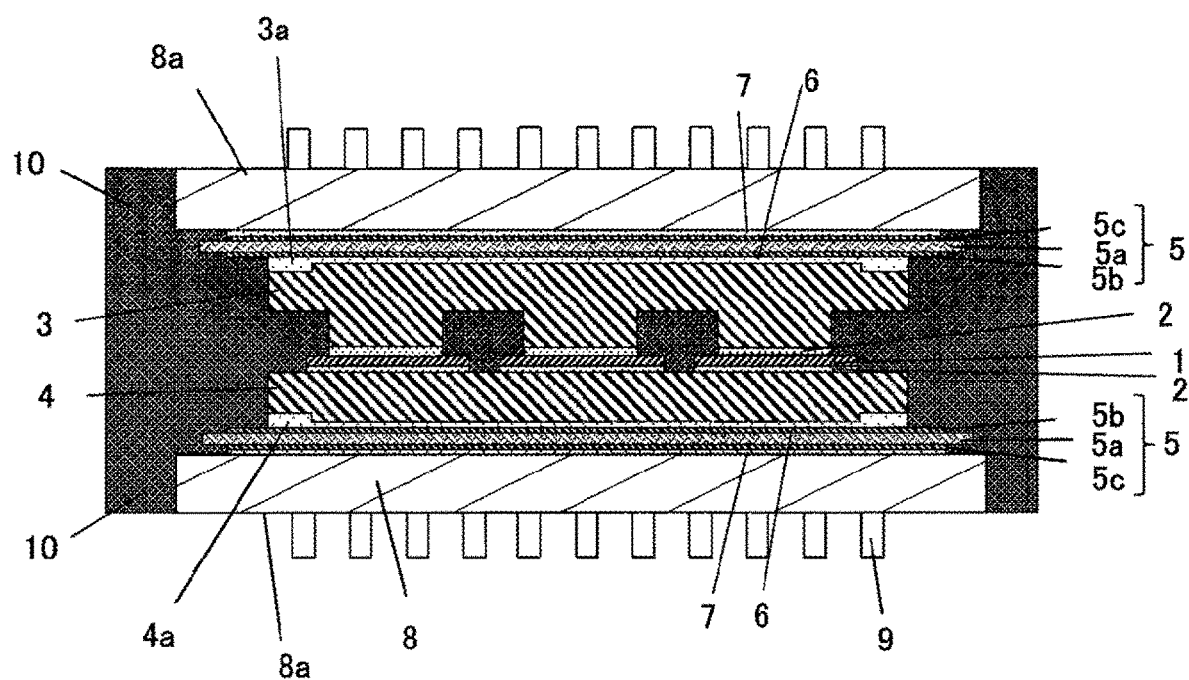
FIG. 9 is a cross-sectional view of a power semiconductor device according to a seventh embodiment of the invention.

FIG. 9 is a cross-sectional view of a power semiconductor device illustrating the sixth embodiment of the invention. In the embodiment illustrated in FIG. 1, the structure in which the power semiconductor element 1 is connected to the first conductor 3 and the second conductor 4 by one connecting material 2 has been described, but this embodiment is also applicable to a power semiconductor device driven in parallel with multiple chips as illustrated in FIG. 9. Specifically, two or more power semiconductor elements are connected to the first conductor 3 and the second conductor 4 via the connecting material 2. As a result, the width in the lateral direction can be narrowed, so that the power semiconductor device can be miniaturized. Also in this embodiment, the recess 4a is provided around the surface of the second conductor 4 that is solder-connected to the insulating substrate 5. As a result, in the peripheral portion of the second conductor 4, the thickness of the connecting material 6 becomes thicker than in the other portions, so that the strain of the solder can be reduced. Further, since the thickness of the solder other than the recess is relatively thin as compared with the periphery, fatigue fracture of the solder can be prevented without increasing the thermal resistance, and a highly reliable power semiconductor device can be realized.

When the plurality of power semiconductor elements 1 are connected to the first conductor 3 and the second conductor 4 as in this embodiment, the surface area of the connecting material 6 is larger than that in the case where the power semiconductor element 1 is singular. Therefore, since the strain of the connecting material 6 in the peripheral portion of the first conductor 3 and the second conductor 4 becomes large, the effect of reducing the solder strain by providing the recesses 3a and 4a can be expected more. Further, by providing the plurality of power semiconductor elements 1, the heat source is dispersed and the thermal resistance can be reduced. Even when the recess 3a and the recess 4a provided in the peripheral portions of the first conductor 3 and the second conductor 4 are formed at positions close to the chip ends, only the outermost chip is affected by the thermal resistance. Therefore, as compared with the case where there is only one power semiconductor element 1, it is possible to suppress an increase in thermal resistance due to the provision of the recess.

Eighth Embodiment

Figure 18:
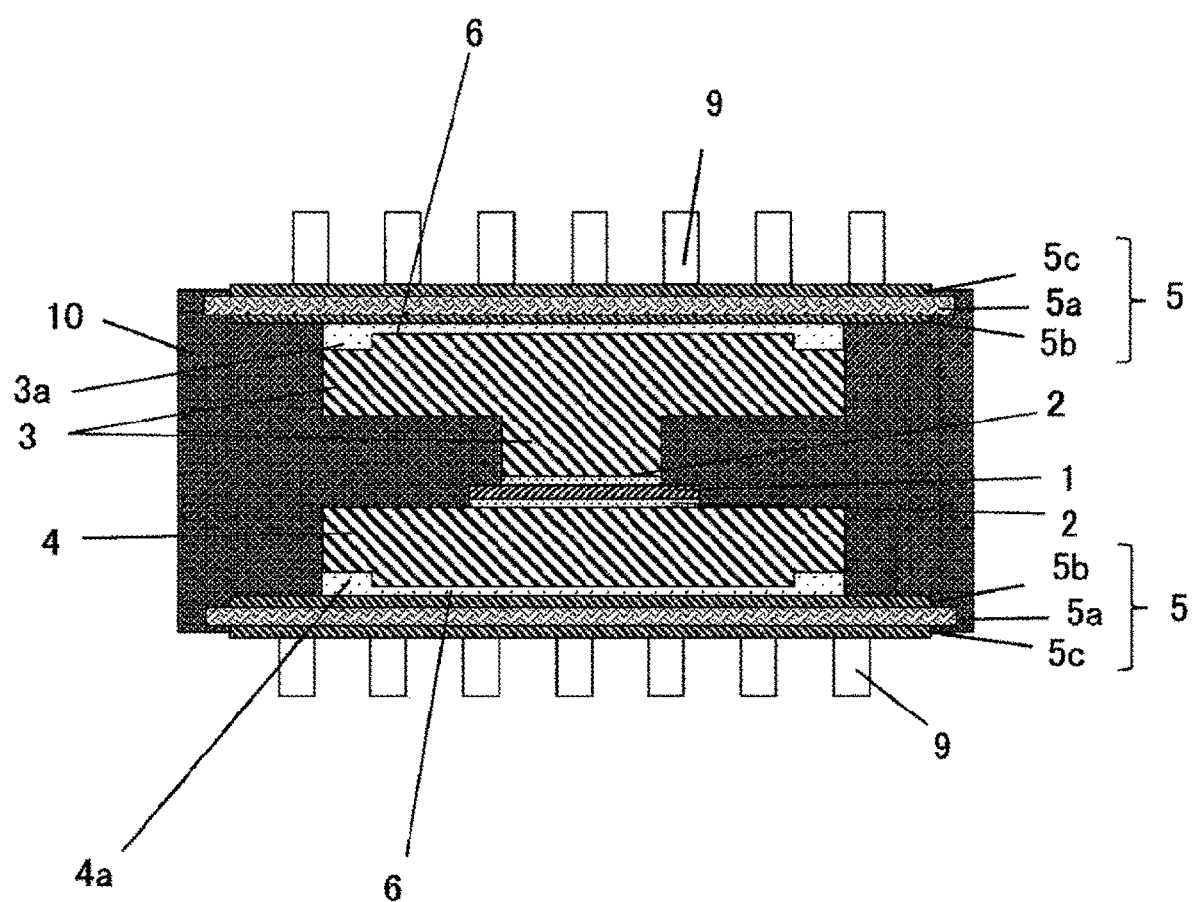
FIG. 18 is a cross-sectional view of the power semiconductor device according to the eighth embodiment of the invention.

An eighth embodiment according to the invention will be described with reference to FIG. 18. FIG. 18 is a cross-sectional view of a power semiconductor device according to the eighth embodiment of the invention. As illustrated in FIG. 18, in this embodiment, the structure may be such that the heat dissipation fins 9 are directly provided on the second conductor layer 5c. In this case, the heat dissipation fins 9 are joined to the second conductor layer 5c by arc welding or the like. As a result, it is possible to reduce the size and the number of parts.

Ninth Embodiment

A method for manufacturing a power semiconductor device according to an embodiment of the invention will be described with reference to FIGS. 1 and 15. FIGS. 15(a) to 15(d) are diagrams illustrating a manufacturing process of a power semiconductor device according to an embodiment of the invention.

Figure 14:
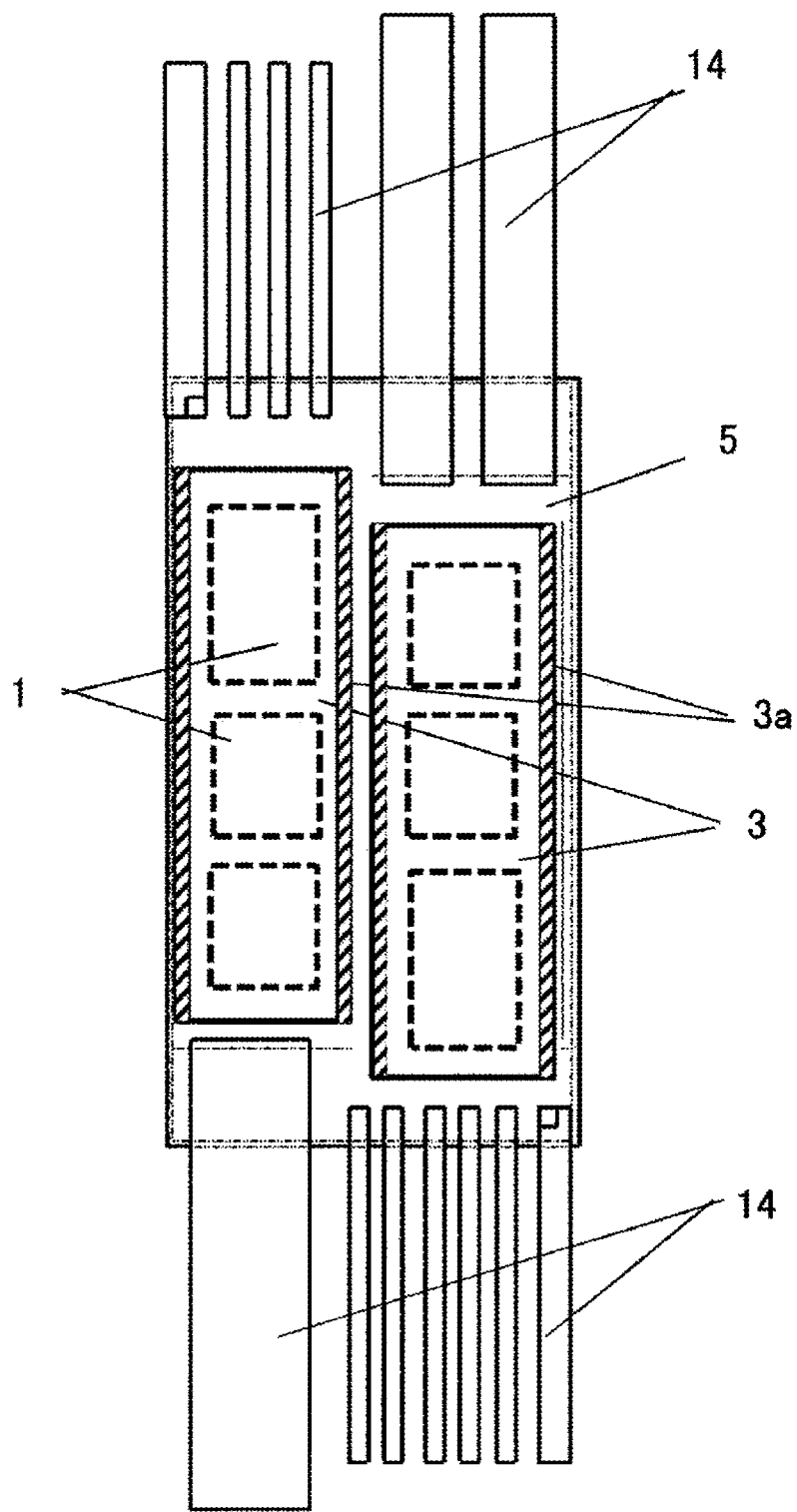
FIG. 14 is a front view of the power semiconductor device according to the seventh embodiment of the invention.
Figure 15A:
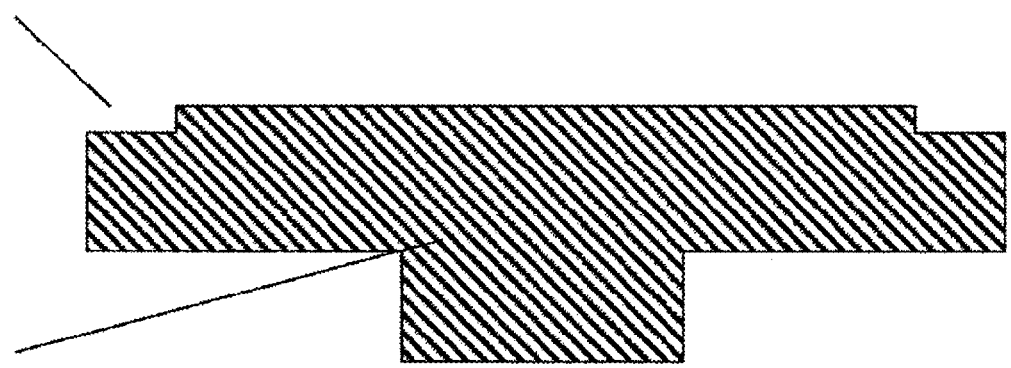
FIG. 15($a$) is a diagram illustrating a manufacturing process of the power semiconductor device according to an embodiment of the invention.
Figure 15A:
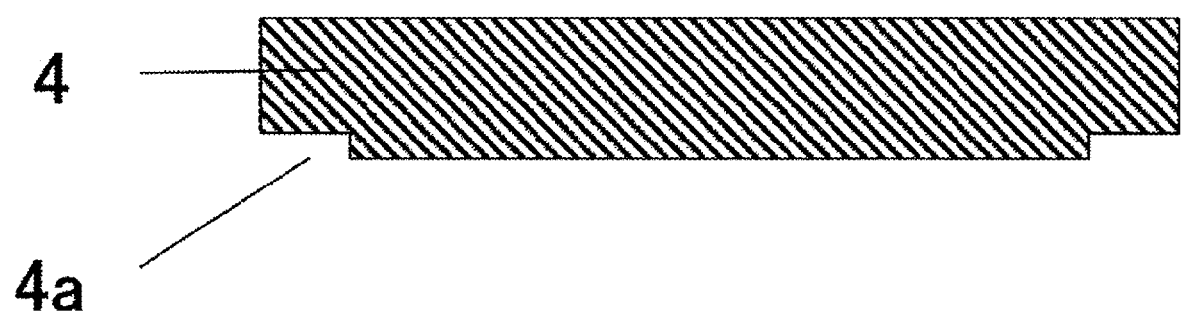
Figure 15B:
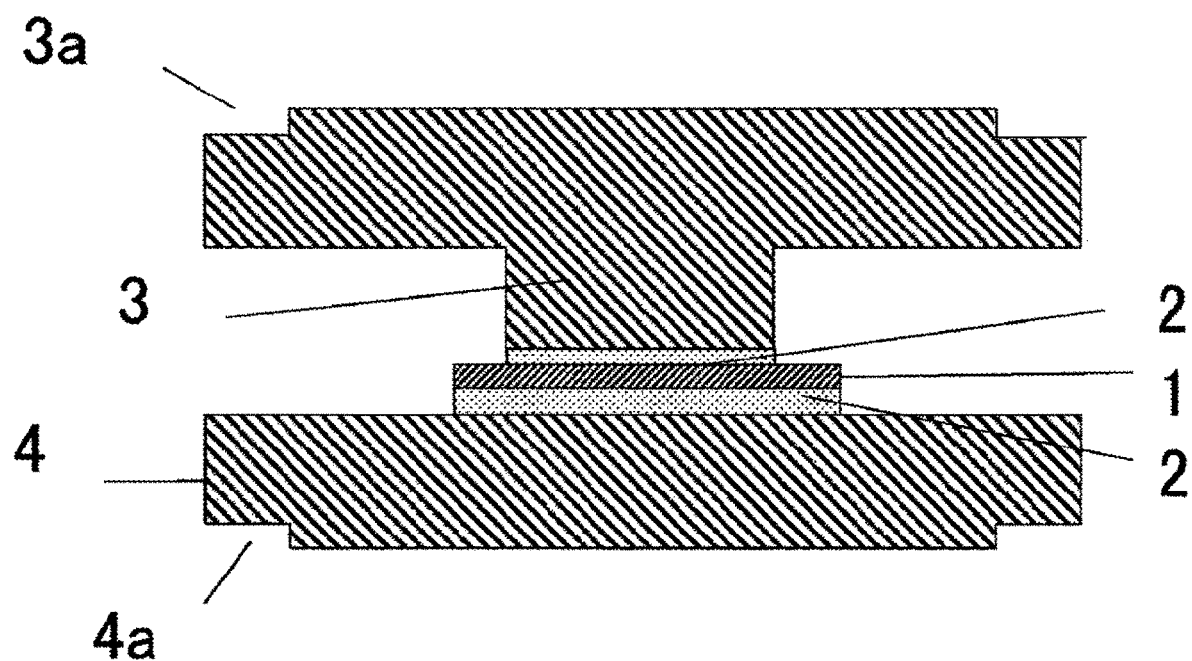

First, as illustrated in FIG. 15(a), the recesses 3a and 4a are provided in the first conductor 3 and the second conductor 4. The recess 3a and the recess 4a are formed by, for example, pulling-out. FIG. 14 is a front view of the power semiconductor device according to this embodiment of the invention. As illustrated in FIG. 14, by providing the recess 3a and the recess 4a along the pulling-out direction, the recess can be formed by pulling-out, and the manufacturability is improved.

Next, as illustrated in FIG. 16(b), the semiconductor element 1 is connected to the first conductor 3 and the second conductor 4 via the connecting material 2. The first conductor 3 and the second conductor 4 are formed of, for example, copper, a copper alloy, aluminum, an aluminum alloy, or the like. The connecting material 2 is formed of a solder material, a sintered material, or the like.

Figure 15C:
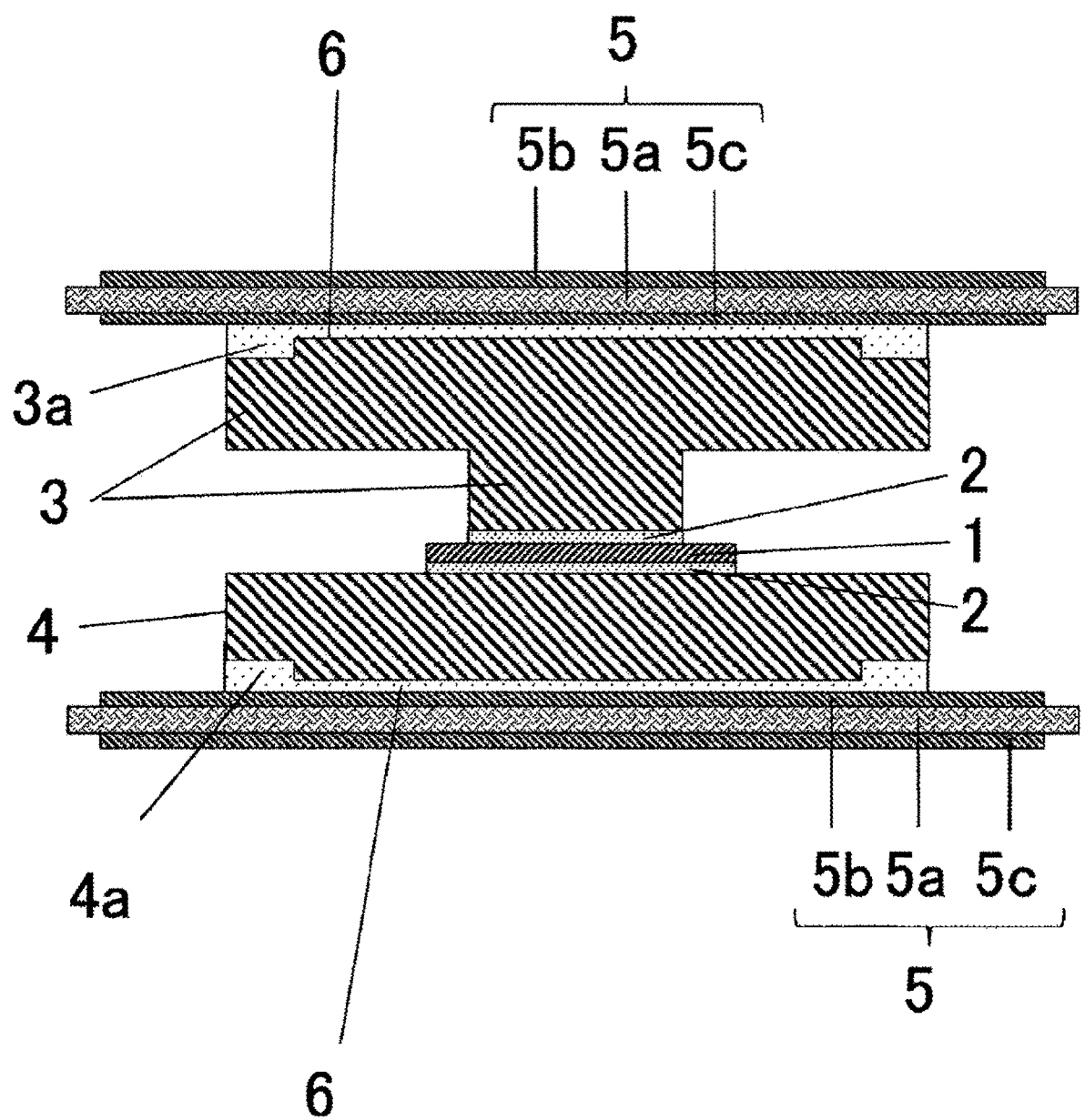

Next, as illustrated in FIG. 15(c), the first conductor and the second conductor 4 are connected to the first conductor layer 5b of the insulating substrate 5 via the connecting material 6. In the insulating substrate 5, the first conductor layer 5b is arranged on one surface of the insulating member 5a, and the second conductor layer 5c is arranged on the other surface. The insulating substrates 5 on both sides may be connected to the first conductor 3 and the second conductor 4 at the same time. By doing so, symmetry can be maintained and warpage deformation during assembly can be suppressed.

Figure 15D:
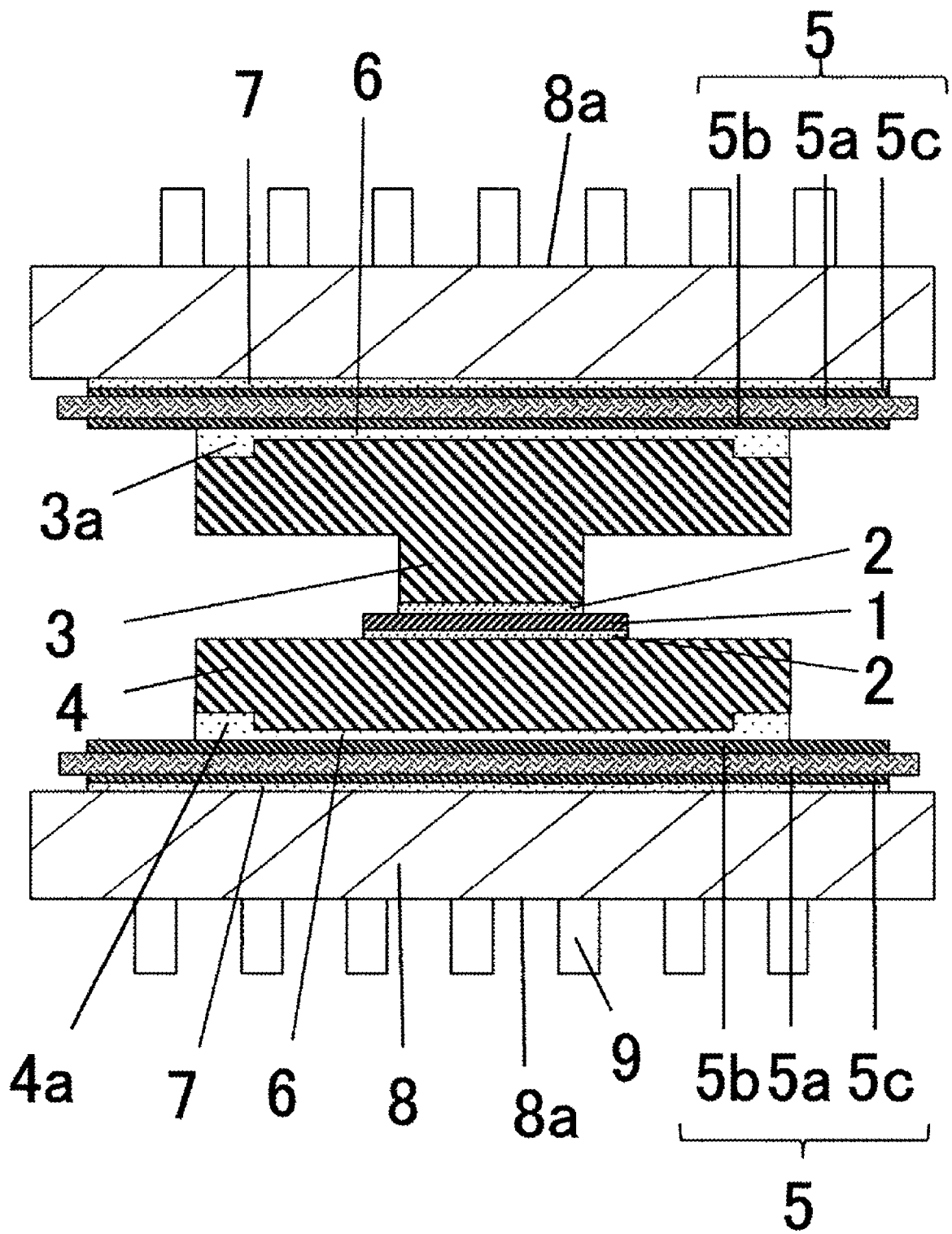

Next, as illustrated in FIG. 15(d), the heat dissipation member 8 is connected to the insulating substrate 5 via the connecting material 7. At this time, the heat dissipation members 8 on both sides may be connected at the same time. By doing so, it is possible to suppress warpage deformation during assembly. The heat dissipation fins 9 are formed on the surface of the heat dissipation member 8.

Finally, as illustrated in FIG. 1, the portions other than the heat dissipation surface 8a on which the heat dissipation fins of the heat dissipation member 8 are formed are sealed with the sealing resin 10.

Figure 10:
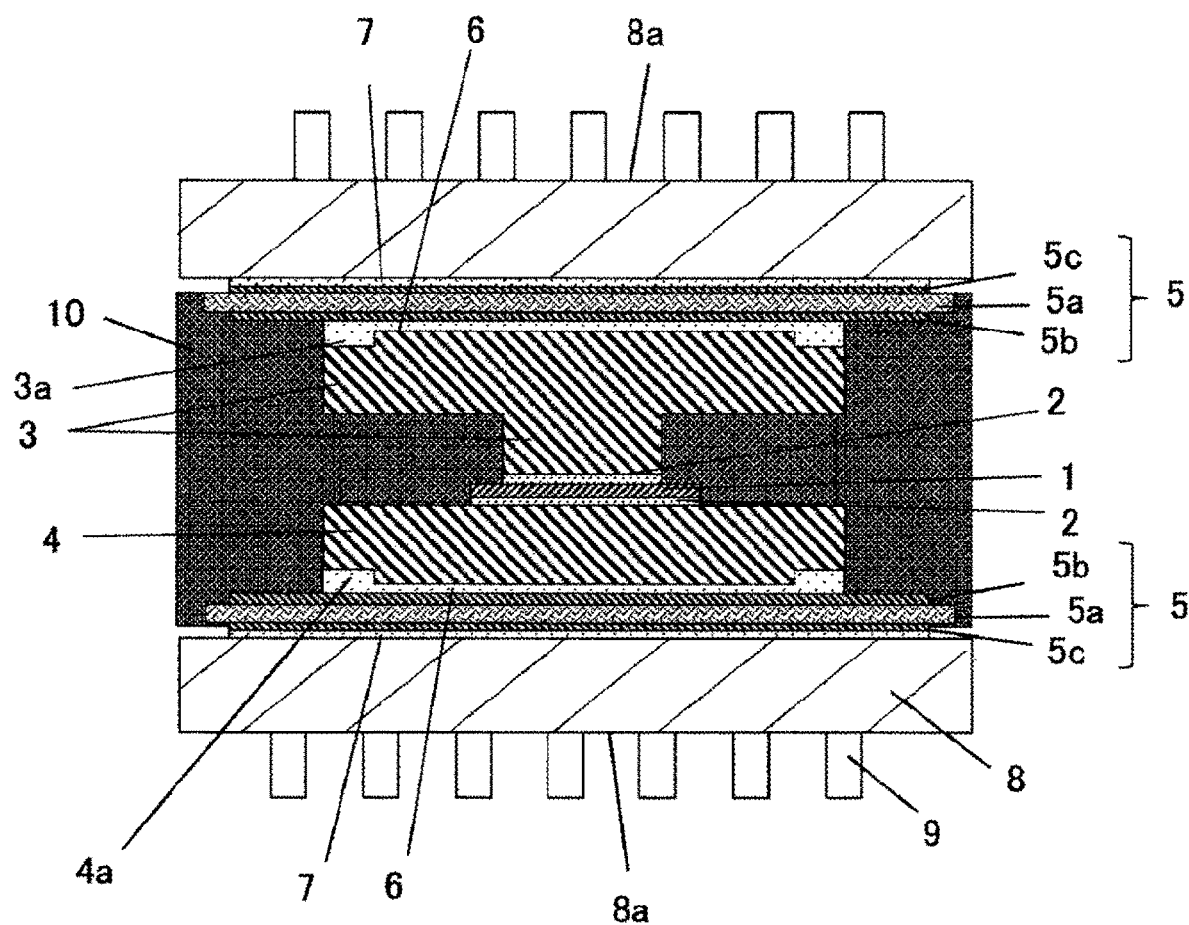
FIG. 10 is a cross-sectional view of a power semiconductor device according to another embodiment of the invention.

In the above-described embodiment, the shape of the heat dissipation fins 9 of the heat dissipation member 8 is a pin fin, but other shapes such as a straight fin and a corrugated fin may be used. Further, in the above-described embodiment, an example is described in which the sealing resin 10 includes the heat dissipation member 8 and the portions other than the heat dissipation surface 8a are sealed, but the portion up to the insulating substrate 5 may be sealed with resin as illustrated in FIG. 10 which is the cross-sectional view of the power semiconductor device according to another embodiment of the invention. In this case, if the second conductor layer 5c of the insulating substrate 5 and the heat dissipation member 8 are connected, the same effect can be obtained. Further, if the thickness of the connecting material 6 is increased too much, the adhesiveness of the resin deteriorates when the resin is sealed, and the resin may be peeled off. Therefore, a sealing member for sealing the insulating substrate 5, the first conductor 3, and the semiconductor element 1 is provided, and the depths of the recesses 3a and 4a are configured to be smaller than the length of the side surface of the first conductor 3 along the depth direction. Thereby, deterioration of the adhesiveness of the resin can be prevented.

Further, in the above-described embodiment, an in-vehicle power semiconductor device mounted on an electric vehicle or a hybrid vehicle has been described as an example, but the invention can be similarly applied to any power semiconductor device in which the conductor is connected to the power semiconductor element 1 by a connecting material, further connected to an insulating substrate, and a heat dissipation portion (surface) is provided on a surface different from the surface to which the conductors are jointed.

In addition, the invention is not limited to the above-described embodiments, and can be applied in various modifications within the scope of the gist of the invention.

REFERENCE SIGNS LIST 1 power semiconductor element
2 connecting material
3 first conductor
3a recess portion
3f wall
4 second conductor
4a recess portion
4b 45 degree line
4c joint surface of the second conductor with the insulating substrate 5
4d intersection
4e recess portion
4f wall
5 insulating substrate
5a insulating member
5b first conductor layer
5c second conductor layer
6 connecting material
7 connecting material
8 heat dissipation member
8a heat dissipation surface
9 heat dissipation fin
10 resin sealing
11 third conductor
11a recess portion
12 fourth conductor
12a recess portion
13 connecting material
14 terminal

The invention claimed is:

1. A power semiconductor device, comprising:
a first insulating substrate on which a first conductor layer is arranged on one surface;
a semiconductor element; and
a first conductor, comprising a peripheral portion and a narrow portion, the peripheral portion connected to the first conductor layer via a first connecting material, the narrow portion connected to the semiconductor element via a second connecting material;
wherein, when viewed from a direction perpendicular to an electrode surface of the semiconductor element,
the narrow portion of the first conductor is narrower than the peripheral portion of the first conductor,
the peripheral portion of the first conductor is larger than the semiconductor element, and
a first recess is formed in the peripheral portion so that a thickness of the first connecting material becomes thicker than other portions.

2. The power semiconductor device according to claim 1, comprising:
a second conductor in which the semiconductor element is connected to a surface opposite to a surface to which the first conductor is connected via a fourth connecting material; and
a second insulating substrate on which a third conductor layer is arranged on one surface,
wherein, when viewed from a direction perpendicular to an electrode surface of the semiconductor element,
the second conductor includes a peripheral portion formed larger than the semiconductor element, and
a second recess is formed in the peripheral portion so that a thickness of a fifth connecting material becomes thicker than other portions.

3. The power semiconductor device according to claim 1, wherein, when viewed from a direction perpendicular to an electrode surface of the semiconductor element, a depth of the first recess is larger on a side farther from the semiconductor element than on a side closer to the semiconductor element.

4. The power semiconductor device according to claim 1, wherein, when viewed from a direction perpendicular to an electrode surface of the semiconductor element, if a length in a width direction parallel to the electrode surface is defined as W and a length in a depth direction is defined as D in the first recess, W/D is 2 or more.

5. The power semiconductor device according to claim 1, wherein
the first conductor includes a protrusion that forms a side portion of the recess on a side close to an outer circumference of the first connecting material, and
the protrusion comes into contact with the first connecting material.

6. The power semiconductor device according to claim 5, wherein the protrusion comes into contact with the first conductor layer.

7. The power semiconductor device according to claim 1, wherein, when viewed from a direction perpendicular to an electrode surface of the semiconductor element, the first recess is formed between a virtual line composed of a set of points separated from an end of the semiconductor element by a thickness of the first conductor and an outer circumference of the first conductor.

8. The power semiconductor device according to claim 1, wherein
the insulating substrate has a second conductor layer arranged on another surface, and
a heat dissipation portion is provided to be connected to the second conductor layer via a third connecting material.

9. The power semiconductor device according to claim 1, wherein
when viewed from an arrangement direction of the first conductor layer and the second conductor layer, a heat dissipation portion has a second peripheral portion formed larger than the first conductor, and
a third recess is formed in the second peripheral portion to make a thickness of the third connecting material thicker than other portions.

10. The power semiconductor device according to claim 1, wherein
the insulating substrate has a second conductor layer arranged on another surface, and
the second conductor layer has fins for heat dissipation.

11. The power semiconductor device according to claim 1, wherein
the peripheral portion is composed of a first side on which the first recess is formed and a second side on which no recess is formed, and
the semiconductor element is arranged so that a distance from the semiconductor element to the first side is smaller than a distance from the semiconductor element to the second side.

12. The power semiconductor device claim 1, comprising a sealing member for sealing the insulating substrate, the first conductor, and the semiconductor element,
wherein a depth of the first recess is smaller than a length of a side surface of the first conductor along the depth direction.

13. The power semiconductor device according to claim 1, wherein two or more semiconductor elements are provided on the first conductor.

* * * * *